(12) United States Patent
Wagner et al.

(10) Patent No.: US 8,519,800 B1
(45) Date of Patent: Aug. 27, 2013

(54) THIRD OVERTONE CRYSTAL-BASED OSCILLATORS HAVING TUNABLE ALL-PASS RC FILTERS THEREIN

(75) Inventors: Gary Wagner, Menlo Park, CA (US); Daniel Linebarger, Los Gatos, CA (US)

(73) Assignee: Integrated Device Technology Inc., San Jose, CA (US)

( * ) Notice: Subject to any disclaimer, the term of this patent is extended or adjusted under 35 U.S.C. 154(b) by 111 days.

(21) Appl. No.: 13/247,566

(22) Filed: Sep. 28, 2011

(51) Int. Cl.
*H03B 5/36* (2006.01)
*H03K 3/354* (2006.01)

(52) U.S. Cl.
USPC .............. 331/116 R; 331/116 FE; 331/108 B

(58) Field of Classification Search
CPC .............. H03B 1/00; H03B 5/20; H03B 5/24; H03B 5/36; H03B 5/366; H03B 5/368; H03B 2200/007; H03B 2200/0098; H03B 2200/0004; H03B 2200/0054; H03L 7/20; H03L 7/183; H03L 7/093; H03L 7/099
USPC ........... 331/116 R, 116 FE, 158, 168, 108 B, 331/135, 139, 107 A
See application file for complete search history.

(56) References Cited

U.S. PATENT DOCUMENTS

| | | | |
|---|---|---|---|
| 4,709,218 A | 11/1987 | Moritani et al. | |
| 5,081,430 A | 1/1992 | Kohsiek | |
| 5,113,153 A | 5/1992 | Soyuer | |
| 5,606,295 A | 2/1997 | Ohara et al. | |
| 6,933,793 B2 | 8/2005 | Patterson, III et al. | |
| 7,332,977 B2 | 2/2008 | Drakhlis et al. | |
| 7,852,167 B2 | 12/2010 | Makuta et al. | |
| 2003/0206070 A1* | 11/2003 | Pietruszynski et al. ....... | 331/158 |

* cited by examiner

*Primary Examiner* — Ryan Johnson
*Assistant Examiner* — Christian L Rivera
(74) *Attorney, Agent, or Firm* — Myers, Bigel, et al

(57) ABSTRACT

Integrated circuit oscillators include a cascaded arrangement of first and second all-pass networks containing a resonator therein, such as a crystal-based resonator. The second all-pass network is configured to provide negative feedback to the first all-pass network at DC (i.e., very low frequencies) and is further configured to provide positive feedback with 90 degrees of phase to the first all-pass network at the resonant frequency of the resonator, which may be the third overtone frequency of a crystal resonator. The first all-pass network includes the resonator and the second all-pass network includes a resistor having resistance matched to a motional resistance of the resonator at the resonant frequency.

19 Claims, 2 Drawing Sheets

THIRD OVERTONE CRYSTAL-BASED OSCILLATORS HAVING TUNABLE ALL-PASS RC FILTERS THEREIN

FIELD OF THE INVENTION

The present invention relates to integrated circuit devices and, more particularly, to integrated circuit oscillators and methods of operating same.

BACKGROUND OF THE INVENTION

A crystal oscillator is a circuit that uses the mechanical resonance of a vibrating crystal to create an electrical signal with a precise frequency. This frequency is commonly used to keep track of time as in a quartz clock, to provide a stable clock signal for integrated circuits, and to stabilize frequencies for radio transmitters and radio receivers. The most common type of piezoelectric material used in a crystal oscillator is a quartz crystal, so oscillator circuits designed around quartz crystals are typically referred to as "crystal oscillators." A quartz crystal provides frequency control by acting as a series resonant circuit. A parallel resonance associated with the crystal electrode capacitance limits how high in frequency the crystal may be operated. The series resonance is typically a few kilohertz lower than the parallel one. Crystals below 30 MHz are generally operated above series resonance and limited by the parallel resonance, which means the crystal appears as an inductive reactance in operation. Any additional circuit capacitance will thus pull the frequency down. For a parallel resonance crystal to operate at its specified frequency, the surrounding electronic circuit has to provide a total parallel capacitance as specified by the crystal manufacturer. Crystals above 30 MHz (up to >200 MHz) are generally operated at series resonance where the impedance appears at its minimum and is equal to the series resistance. For these crystals, the series resistance is specified (<100Ω) instead of the parallel capacitance. To reach higher frequencies, a crystal can be made to vibrate at one of its overtone modes, which typically occur near integer multiples of the crystal's fundamental resonant frequency. Only odd numbered overtones have resonant modes. Such a crystal is typically referred to as a 3rd, 5th, or even 7th overtone crystal. To accomplish overtone operation, the oscillator circuit typically includes an additional LC circuit to select the desired overtone.

Some examples of overtone crystal oscillators are disclosed in U.S. Pat. No. 4,709,218 to Moritani et al., entitled "Overtone Crystal Oscillator" and in U.S. Pat. No. 5,081,430 to Kohsiek, entitled "Overtone Crystal Oscillator Having Resonance Amplifier in Feedback Path." Additional examples of overtone crystal oscillators utilize circuitry to provide resonant operation in a third overtone mode. Some of these examples are disclosed in U.S. Pat. No. 5,113,153 to Soyuer, entitled "High-Frequency Monolithic Oscillator Structure for Third-Overtone Crystals," U.S. Pat. No. 7,332,977 to Drakhlis et al., entitled "Crystal Clock Generator Operating at Third Overtone of Crystal's Fundamental Frequency," and U.S. Pat. No. 7,852,167 to Makuta et al., entitled "Third Overtone Crystal Oscillator."

SUMMARY OF THE INVENTION

Integrated circuit oscillators according to embodiments of the invention include a cascaded arrangement of a first all-pass network, which contains a resonator, and a second all-pass network configured to provide negative feedback to the first all-pass network at low frequencies far below the frequency of operation. These first and second all-pass networks provide zero degrees of phase at very low frequencies, but collectively provide 180 degrees of positive feedback within the oscillator at a resonant frequency of the resonator. In the event the resonator is a crystal resonator, the resonant frequency may be a third overtone frequency of the crystal resonator. In particular, setting a center frequency of the all-pass networks to that of a third overtone crystal may yield an open loop phase of about 106 degrees at the fundamental frequency of the crystal resonator, which means the oscillator will be stable at the fundamental frequency. Moreover, in the event the first and second all-pass networks are configured as equivalent networks, then quadrature outputs will be produced by each network when the oscillator is tuned to the series resonant frequency of the crystal resonator. The oscillation frequency of the oscillator may also be changed without requiring external components by changing the values of the capacitors within the all-pass networks. This ability to tune the center frequency of each network renders the cascaded arrangement advantageous for providing accurate temperature compensation of the crystal resonator and/or frequency tuning and modulation.

According to further embodiments of the invention, an integrated circuit oscillator may include a cascaded arrangement of first and second all-pass networks containing a resonator therein. The second all-pass network is configured to provide negative feedback to the first all-pass network at very low frequencies, but alternatively provide positive feedback with about 70-110 degrees of phase (e.g., 90 degrees of phase) to the first all-pass network at the resonant frequency of the resonator, which may be a third overtone frequency of a crystal resonator. According to some of these embodiments of the invention, the first all-pass network includes the resonator and the second all-pass network includes a resistor having resistance that is matched to a motional resistance of the resonator at the resonant frequency. The first all-pass network may include a first tunable all-pass RC filter therein. This filter may contain at least one bank of capacitors therein responsive to a multi-bit control word that sets an amount of capacitance provided within the filter by the at least one bank. This at least one bank of capacitors may by a binary-weighted bank of capacitors, for example.

According to additional embodiments of the invention, the first and second all-pass networks may include first and second differential amplifiers, respectively. In particular, the first differential amplifier may include a first pair of input transistors and the resonator may be a crystal resonator having first and second ports electrically coupled to the first pair of input transistors. For example, the first pair of input transistors may be MOSFETs (e.g., N-type MOSFETs) and the crystal resonator may have first and second ports electrically coupled to the source terminals of the first pair of MOSFETs. In addition, the first all-pass network may include a first tunable all-pass RC filter electrically coupled to the drain terminals of the first pair of input transistors.

According to still further embodiments of the invention, a periodic signal generator is provided, which includes first and second differential amplifiers and a crystal resonator having first and second ports electrically coupled across a first pair of nodes of the first differential amplifier. A first all-pass filter is also provided, which has a pair of input terminals electrically coupled to a pair of differential output nodes of the first differential amplifier and a pair of output terminals electrically coupled to a pair of differential input nodes of the second differential amplifier. A second all-pass filter is provided, which has a pair of input terminals electrically coupled to a pair of differential output nodes of the second differential amplifier and a pair of output terminals electrically coupled to a pair of differential input nodes of first second differential amplifier. These first and second all-pass filters may be responsive to respective multi-bit control words that set center frequencies therein. In some of these embodiments of the invention, the first all-pass filter may be configured so that a magnitude of the resistance and a magnitude of the impedance therein are equivalent at a third overtone frequency of the crystal resonator.

DETAILED DESCRIPTION OF EMBODIMENTS

Figure 1:
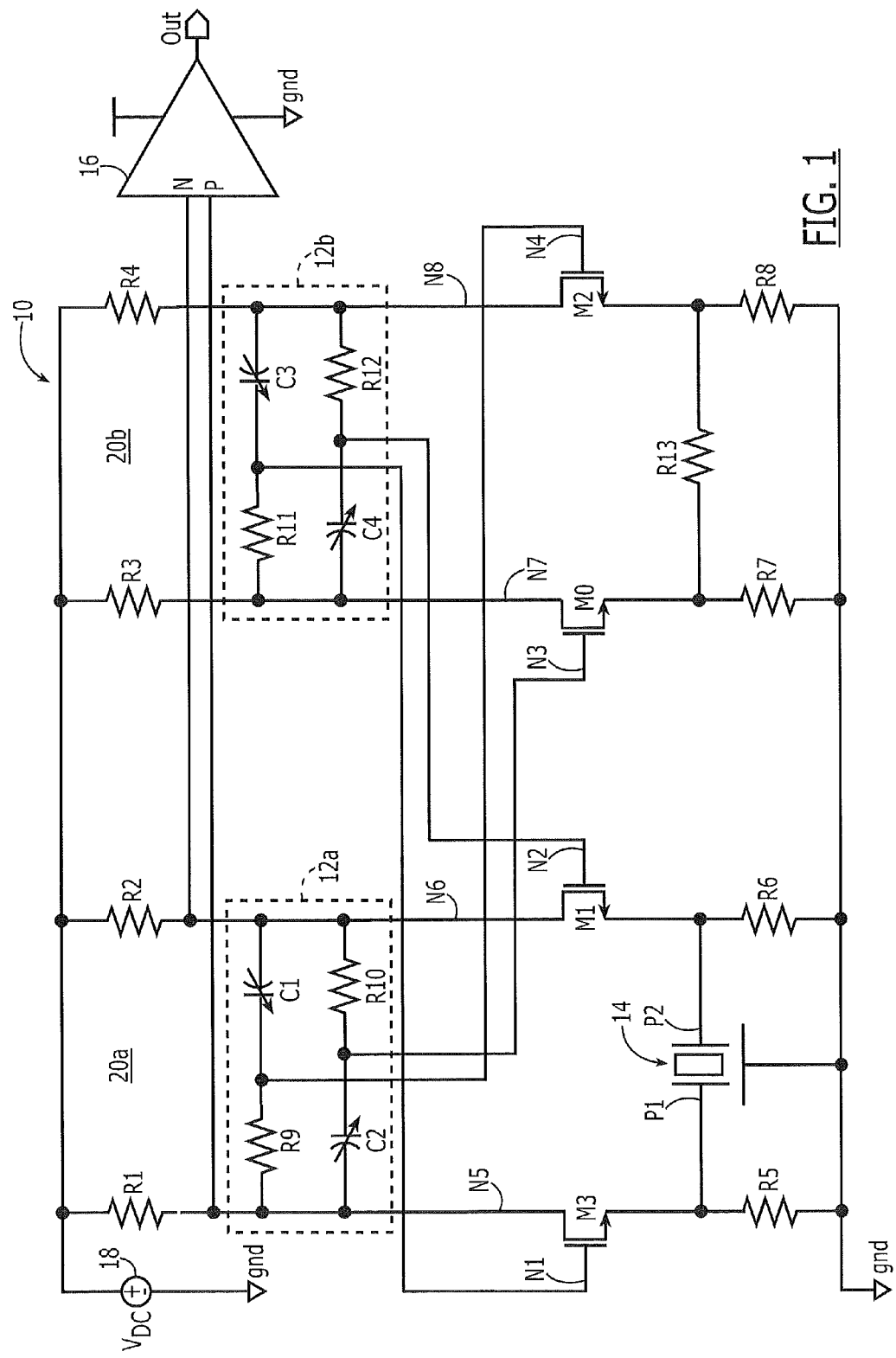
FIG. 1 is an electrical schematic of an oscillator according to an embodiment of the invention.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

It will be understood that when an element is referred to as being "connected to" or "coupled to" another element (and variants thereof), it can be directly on, connected or coupled to the other element or intervening elements may be present. In contrast, when an element is referred to as being "directly connected to" or "directly coupled to" another element (and variants thereof), there are no intervening elements present. Like reference numerals refer to like elements throughout.

It will be understood that, although the terms first, second, third, etc. may be used herein to describe various elements, components, regions and/or sections, these elements, components, regions and/or sections should not be limited by these terms. These terms are only used to distinguish one element, component, region or section from another region or section. Thus, a first element, component, region or section discussed below could be termed a second element, component, region or section without departing from the teachings of the present invention.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprising", "including", having" and variants thereof, when used in this specification, specify the presence of stated features, operations, elements, and/or components, but do not preclude the presence or addition of one or more other features, operations, elements, components, and/or groups thereof. In contrast, the term "consisting of" when used in this specification, specifies the stated features, operations, elements, and/or components, and precludes additional features, operations, elements and/or components.

Unless otherwise defined, all terms (including technical and scientific terms) used herein have the same meaning as commonly understood by one of ordinary skill in the art to which the present invention belongs. For example, the term "at DC" used herein and in the claims will be understood by one of ordinary skill in the art as meaning "very low frequencies" approaching a quiescent biasing condition. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 illustrates an integrated circuit oscillator 10 according to an embodiment of the invention. This oscillator 10 includes a cascaded arrangement of a first all-pass network 20a containing a resonator 14, and a second all-pass network 20b, which is configured to provide negative feedback to the first all-pass network 20a at very low frequencies. These first and second all-pass networks 20a, 20b advantageously provide zero degrees of phase at very low frequencies, but collectively provide 180 degrees of positive feedback within the oscillator 10 at a resonant frequency of the resonator 14, which is shown as a crystal resonator having first and second ports P1, P2. This resonant frequency may be a $3^{rd}$-overtone frequency of the crystal resonator 14.

In the oscillator of FIG. 1, the second all-pass network 20b is configured to provide negative feedback to the first all-pass network 20a at very low frequencies, but alternatively provide positive feedback with about 70-110 degrees of phase to the first all-pass network 20a at the resonant frequency of the crystal resonator 14. Moreover, by properly sizing the elements of the second all-pass network 20b relative to the first all-pass network 20a, as described herein, the second all-pass network 20b can provide positive feedback with 90 degrees of phase to the first all-pass network 20a.

Figure 2:
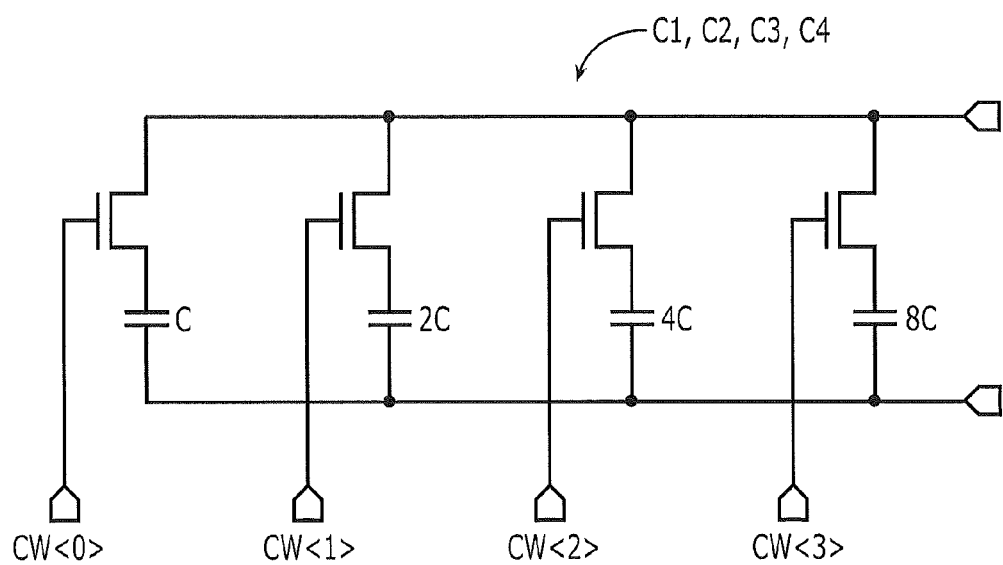
FIG. 2 is an electrical schematic of one embodiment of a bank of capacitors responsive to a multi-bit control word.

As shown by FIG. 1, the first all-pass network 20a is configured as a combination of a first differential amplifier, which is powered by a supply voltage source 18 (e.g., $V_{Dc}$=1.2 Volts), and a first tunable all-pass RC filter 12a, which is electrically coupled across a differential output of the first differential amplifier at output nodes N5, N6. This first RC filter 12a includes resistors R9 and R10 and variable capacitors C1 and C2, connected as illustrated. As illustrated by FIG. 2, each of the variable capacitors C1 and C2 may be configured as a corresponding binary-weighted capacitor bank that is responsive to a multi-bit control word. This multi-bit control word can be used to set a center frequency of the first RC filter 12a. Alternatively, each of the variable capacitors described herein may be embodied as varactor capacitors responsive to adjustable bias voltages, such as those disclosed in commonly assigned U.S. application Ser. No. 13/077,584, filed Mar. 31, 2011, the disclosure of which is hereby incorporated herein by reference.

The first differential amplifier is illustrated as including a first differential pair of input transistors, which are shown as NMOS input transistors M1 and M3, and resistors R1-R2, R5-R6, connected as illustrated. These NMOS transistors may be configured as transistors having a gate length of about 130 nm and a channel width of about 80 um, with a transconductace ($g_m$) of about 11 mmhos. The NMOS input transistors M1 and M3 have source terminals electrically connected to the first and second ports P1, P2 of the crystal resonator 14 and drain terminals electrically connected to the first tunable all-pass RC filter 12a at nodes N5, N6. The resistors R1-R2, R5-R6 and R9-R10 may be equivalently sized (e.g., R1-R2, R5-R6 and R9-R10=600 ohms) in some embodiments of the invention. Feedback is provided within the oscillator 10 by electrically connecting the gate terminals of the NMOS input transistors M1 and M3 at nodes N1, N2 to the differential output nodes of the second all-pass RC filter 12b, which are provided by the electrical connection between resistor R11 and variable capacitor C3 and the electrical connection between resistor R12 and variable capacitor C4.

The second all-pass network 20b is configured as a second differential amplifier, which is powered by the supply voltage source 18, and a second tunable all-pass RC filter 12b, which is electrically coupled across a differential output of the second differential amplifier at output nodes N7, N8. This second RC filter 12b includes resistors R11 and R12 and variable capacitors C3 and C4, connected as illustrated. As illustrated by FIG. 2, each of the variable capacitors C3 and C4 may be configured as a respective binary-weighted capacitor bank. In particular, the variable capacitors C3 and C4 may be programmed to set a center frequency of the second RC filter 12b, which can be matched to the center frequency of the first RC filter 12a. According to some embodiments of the invention, the variable capacitors C1-C4 may be set to equivalent values and the resistors R9-R12 may be set to equivalent values. These capacitors C1-C4 may be set to have capacitances in a range from about 300 fF to about 3 pF.

The second differential amplifier is illustrated as including a second differential pair of input transistors, which are shown as NMOS input transistors M0 and M2, and resistors R3-R4, R7-R8, connected as illustrated. The NMOS transistors M0 and M2 have source terminals electrically connected to respective terminals of a resistor R13, which can be matched to have a resistance equivalent to a motional resistance of the crystal resonator 14 at its third overtone frequency. This resistor R13 can have a resistance of about 50 ohms. The NMOS transistors M0 and M2 also have drain terminals electrically connected to the second tunable all-pass RC filter 12b at nodes N7, N8. The resistors R3-R4, R7-R8 and R11-R12 may be equivalently sized (e.g., 600 ohms). This second differential amplifier receives a differential signal at nodes N3, N4, which are the gate terminals of the NMOS transistors M0 and M2. This differential signal is generated at the differential output nodes of the first all-pass RC filter 12a, which are provided by the electrical connection between resistor R9 and variable capacitor C1 and the electrical connection between resistor R10 and variable capacitor C2, as illustrated.

Referring still to FIG. 1, an output buffer 16 is provided to convert a differential output signal generated at differential output nodes N5, N6 of the first all-pass network 20a into a periodic signal that can be tuned (via the variable capacitors C1-C4) to have a frequency equivalent to a $3^{rd}$-overtone frequency of the crystal resonator 14. As shown by FIG. 2, tuning (including temperature compensation) may be provided by configuring each of the variable capacitors C1-C4 as a bank of capacitors (C, 2C, 4C, and 8C), which are responsive to a control word CW<0:3>. Furthermore, according to alternative embodiments of the invention, an oscillator having reduced power consumption requirements relative to the oscillator 10 of FIG. 1 may be provided by doubling the resistance values of R3-R4, R7-R8, and R11-R12 in the second all-pass network 20b relative to the resistance values of R1-R2, R5-R6 and R9-R10 in the first all-pass network 20a and by halving the widths of NMOS transistors M0, M2 relative to M1, M3 and halving the capacitance values of C3-C4 relative to C1-C2.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An oscillator, comprising:
a cascaded arrangement of a first all-pass network comprising a resonator and a second all-pass network configured to provide negative feedback to said first all-pass network at DC, said first and second all-pass networks collectively configured to provide 180 degrees of feedback within the oscillator at a resonant frequency of the resonator.

2. The oscillator of claim 1, wherein said second all-pass network comprises a matching resistor having resistance matched to a motional resistance of the resonator at the resonant frequency.

3. The oscillator of claim 1, wherein said first all-pass network comprises a first tunable all-pass RC filter therein, said first tunable all-pass RC filter comprising a combination of a high-pass RC filter and a low-pass RC filter.

4. The oscillator of claim 3, wherein the first tunable all-pass filter comprises at least one bank of varactor capacitors.

5. The oscillator of claim 3, wherein the first tunable all-pass filter comprises at least one binary-weighted bank of capacitors therein responsive to a multi-bit control word.

6. The oscillator of claim 1, wherein said first and second all-pass networks comprise respective first and second differential amplifiers.

7. The oscillator of claim 6, wherein the first differential amplifier comprises a first pair of input transistors; and wherein the resonator is a crystal resonator having first and second ports electrically coupled to the first pair of input transistors.

8. The oscillator of claim 7, wherein the first pair of input transistors are MOSFETs; and wherein the crystal resonator has first and second ports electrically coupled to the source terminals of the first pair of input transistors.

9. The oscillator of claim 8, wherein said first all-pass network comprises a first tunable all-pass RC filter electrically coupled to the drain terminals of the first pair of input transistors.

10. An oscillator, comprising:
a cascaded arrangement of first and second all-pass networks comprising a resonator therein, said second all-pass network configured to provide negative feedback to said first all-pass network at DC and further provide positive feedback with 90 degrees of phase to said first all-pass network at a resonant frequency of the resonator, said first all-pass network comprises a first tunable all-pass RC filter therein configured as a first RC filter and a second RC filter connected in antiparallel relative to each other as a low-pass filter and a high-pass filter.

11. The oscillator of claim 10, wherein said first all-pass network comprises the resonator, which is a crystal resonator; and wherein said second all-pass network comprises a matching resistor having resistance matched to a motional resistance of the resonator at the resonant frequency.

12. The oscillator of claim 10, wherein the first tunable all-pass filter comprises at least one binary-weighted bank of capacitors therein responsive to a multi-bit control word.

13. A periodic signal generator, comprising:
first and second differential amplifiers;
a crystal resonator having first and second ports electrically coupled across a first pair of nodes of said first differential amplifier;
a first all-pass filter having a pair of input terminals electrically coupled to a pair of differential output nodes of said first differential amplifier and a pair of output terminals electrically coupled to a pair of differential input nodes of said second differential amplifier, said first all-pass filter comprising a pair of RC filters connected in antiparallel across the differential output nodes of said first differential amplifier as a first low pass filter and a first high pass filter; and a second all-pass filter having a pair of input terminals electrically coupled to a pair of differential output nodes of said second differential amplifier and a pair of output terminals electrically coupled to a pair of differential input nodes of said first differential amplifier, said second all-pass filter comprising a pair of RC filters connected in antiparallel across the differential output nodes of said second differential amplifier as a second low pass filter and a second high pass filter.

14. The oscillator of claim 13, wherein said first and second all-pass filters are responsive to respective multi-bit control words that set respective center frequencies therein.

15. The oscillator of claim 13, wherein the first all-pass filter is configured so that a magnitude of the resistance and a magnitude of the impedance therein are equivalent at a third overtone frequency of the crystal resonator.

16. The oscillator of claim 13, wherein said first differential amplifier is a first MOSFET amplifier having a first pair of input transistors therein; wherein said second differential amplifier is a second MOSFET amplifier having a second pair of input transistors therein; and wherein the first and second ports of the crystal resonator are electrically coupled to the source terminals of the first pair of input transistors.

17. The oscillator of claim 3, wherein said first and second all-pass networks comprise respective first and second differential amplifiers; wherein said first tunable all-pass RC filter comprises first and second RC filters; wherein the first RC filter comprises a series combination of a first resistor and a first capacitor and the second RC filter comprises a series combination of a second resistor and a second capacitor; wherein the first and second resistors have first terminals electrically connected to first and second output nodes of the first differential amplifier, respectively, and the first and second capacitors have first terminals electrically connected to the second and first output nodes of the first differential amplifier, respectively.

18. The oscillator of claim 17, wherein the first and second RC filters are connected in antiparallel across the first and second output nodes of the first differential amplifier.

19. The oscillator of claim 17, wherein the resistor and capacitor within the first RC filter have second terminals that are electrically connected together and to a second input of the second differential amplifier; and wherein the resistor and capacitor within the second RC filter have second terminals that are electrically connected together and to a first input of the second differential amplifier.

* * * * *